(12) United States Patent
Schimel

(10) Patent No.: US 12,149,238 B2
(45) Date of Patent: Nov. 19, 2024

(54) CURRENT SOURCED, VOLTAGE CLAMPED, HIGH SPEED MOSFET DRIVER

(71) Applicant: Microchip Technology Incorporated, Chandler, AZ (US)

(72) Inventor: Paul Schimel, Algonquin, IL (US)

(73) Assignee: Microchip Technology Incorporated, Chandler, AZ (US)

( * ) Notice: Subject to any disclaimer, the term of this patent is extended or adjusted under 35 U.S.C. 154(b) by 68 days.

(21) Appl. No.: 18/125,789

(22) Filed: Mar. 24, 2023

(65) Prior Publication Data

US 2023/0308098 A1 Sep. 28, 2023

Related U.S. Application Data

(60) Provisional application No. 63/323,245, filed on Mar. 24, 2022.

(51) Int. Cl.
*H03K 17/687* (2006.01)
*H03K 17/06* (2006.01)
*H03K 17/12* (2006.01)

(52) U.S. Cl.
CPC ......... *H03K 17/687* (2013.01); *H03K 17/063* (2013.01); *H03K 17/122* (2013.01)

(58) Field of Classification Search
None
See application file for complete search history.

(56) References Cited

U.S. PATENT DOCUMENTS

| 7,570,085 | B2* | 8/2009 | Ishikawa | H03K 17/0406 327/108 |
| 8,054,110 | B2* | 11/2011 | Wang | H03K 19/018521 327/333 |
| 9,525,413 | B2* | 12/2016 | Roberts | H01L 29/2003 |
| 10,917,081 | B1* | 2/2021 | Nguyen | H03K 17/18 |
| 11,171,643 | B1* | 11/2021 | Murnane | H03K 17/165 |
| 11,258,443 | B2* | 2/2022 | Sahoo | H02M 1/32 |
| 2009/0002054 | A1* | 1/2009 | Tsunoda | H03K 17/063 327/374 |

(Continued)

FOREIGN PATENT DOCUMENTS

GB 2475518 A 5/2011 ............. H02M 1/10

OTHER PUBLICATIONS

International Search Report and Written Opinion, Application No. PCT/US2023/016193, 16 pages, Jun. 16, 2023.

*Primary Examiner* — Thomas J. Hiltunen
(74) *Attorney, Agent, or Firm* — SLAYDEN GRUBERT BEARD PLLC

(57) ABSTRACT

An apparatus includes an apparatus input to receive a voltage input, an apparatus output to drive an output metal oxide semiconductor field effect transistor (MOSFET) at least partially based upon the voltage input, a current source circuit to provide a current source to the apparatus output when the voltage input rises above a first threshold and before the voltage input rises above a second threshold, a voltage clamp circuit to provide a clamped output voltage to the apparatus output when the voltage input rises above the second threshold, and a current sink circuit to provide a current sink to the apparatus output when the voltage input falls below the second threshold and before the voltage input reaches the first threshold.

21 Claims, 7 Drawing Sheets

(56) References Cited

U.S. PATENT DOCUMENTS

| | | | |
|---|---|---|---|
| 2009/0066402 A1* | 3/2009 | Hiyama | H03K 17/168 |
| | | | 327/392 |
| 2010/0283515 A1 | 11/2010 | Kelley et al. | 327/109 |
| 2016/0182034 A1* | 6/2016 | Wagoner | H03K 17/567 |
| | | | 327/432 |
| 2021/0044085 A1 | 2/2021 | Egawa | |
| 2021/0159898 A1 | 5/2021 | Westwick et al. | |

* cited by examiner

CURRENT SOURCED, VOLTAGE CLAMPED, HIGH SPEED MOSFET DRIVER

PRIORITY

The present application claims priority to U.S. Patent Application No. 63/323,245 filed Mar. 24, 2022, the contents of which are hereby incorporated in their entirety.

FIELD OF THE INVENTION

The present disclosure relates to analog electronics and, more particularly, to a current sourced, voltage clamped, high speed metal-oxide-semiconductor field-effect-transistor (MOSFET) driver.

BACKGROUND

Many high-current MOSFET drivers are based on voltage-sourced technologies. The operation of these solutions traverses the Miller plateau slower during turn-on and turn-off because they are limited by the impedance of their respective output totem pole structure. On turn-on, for example, if the initial peak current into Cgs is 10 A, as voltage across the gate and source (Vgs) approaches the supply voltage value of the positive rail, the drive current drops to zero (as per ohms law). While the driven MOSFET channel is accumulating charge during turn-on and Vgs is traversing the Miller plateau, this slower switching leads to differential oscillations in fast SiC modules with multiple unmatched die in parallel. Oscillations in the module are detrimental to module operation and reliability and often destructive at high enough power current to couple to adjacent opposite side switch, such as in a half-bridge application. For a MOSFET, Ciss is the input capacitance, Crss is the reverse transfer capacitance, and Coss is the output capacitance. A voltage source gate driver often uses external clamps (such as an active Miller clamp) to provide a truly low impedance turn-off state and avoid Cdv/dt turn on from fast commutation where Coss charges quickly and Crss couples charge into Cgs and the off-state gate drive impedance.

Moreover, a standard voltage-sourced driver cannot operate the switches as fast as a current-sourced driver to meet given compliance requirements for current. In addition, digital solutions that provide microprocessors in the drive circuitry to slow down or control on state switching may cause even larger windows for oscillations to occur. Also, mission critical applications often require exhaustive induction testing on firmware software in critical applications, such as those for gate drive for MOSFETs. This testing can very expensive and very lengthy.

Examples of the present disclosure may address one or more of these issues.

DETAILED DESCRIPTION

Figure 1:
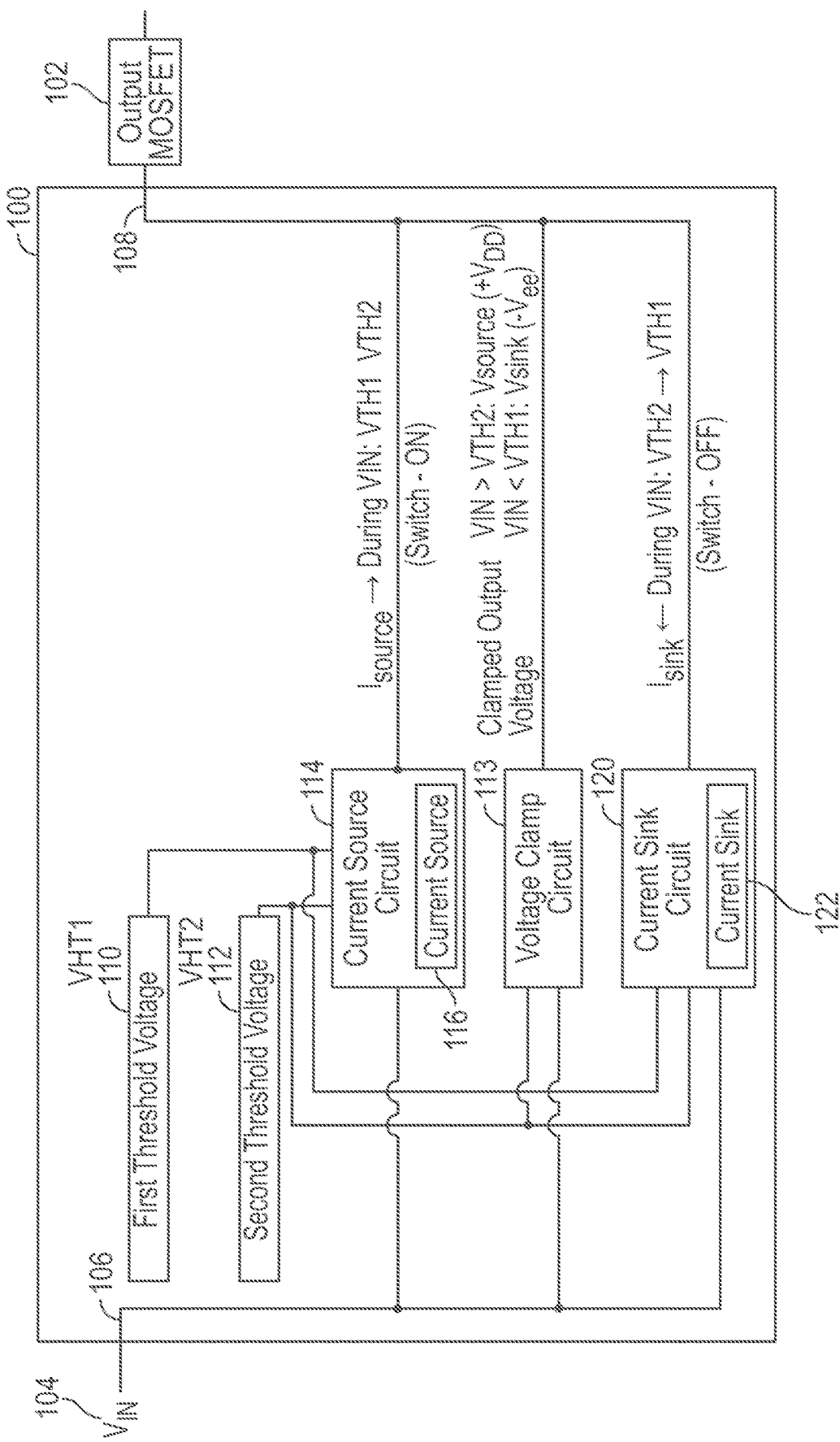
FIG. 1 is an illustration of an apparatus for implementation of a current-sourced, voltage clamped, high speed MOSFET driver.

FIG. 1 is an illustration of an apparatus 100 for implementation of a current-sourced, voltage clamped, high speed metal-oxide-semiconductor field-effect-transistor driver. Apparatus 100 may be implemented within any suitable context, product, or device. In one example, apparatus 100 may be implemented within a gate driver integrated circuit. Apparatus 100 may be implemented alongside any suitable number of drivers within an integrated circuit. Apparatus 100 may be implemented within a processor, microcontroller, application-specific integrated circuit, a field-programmable gate array, or any other suitable electronic device.

Apparatus 100 may include an apparatus input or input terminal 106 to receive a voltage input. Apparatus 100 may include an apparatus output or output terminal 108 to drive any suitable transistor, such as a MOSFET, shown in FIG. 1 as output MOSFET 102. Apparatus output or output terminal 108 may drive a gate of output MOSFET 102 with respect to its source. Apparatus 100 may receive a voltage input VIN 104.

The source of output MOSFET 102 may be connected to any suitable output or application. The drain of output MOSFET 102 may be connected to any suitable output or application, such part of a switching power converter.

Apparatus 100 may include a current source circuit 114, a voltage clamp circuit 118, and a current sink circuit 120. Circuits 114, 118, 120 may be implemented in any suitable manner, such as by analog circuitry, digital circuitry, application-specific integrated circuit, field programmable gate arrays, programmable logic, instructions for execution by a processor (not shown), or any suitable combination thereof.

Current source circuit 114 may include a current source 116. Current source 116 may be implemented in any suitable manner, such as by analog circuitry, digital circuitry, application-specific integrated circuit, field programmable gate arrays, programmable logic, instructions for execution by a processor (not shown), or any suitable combination thereof. Current source 116 may be implemented by, for example, an inductor operating in continuous charge mode. Current source 116 may be configured to provide a current of any suitable value. The suitable value may be, for example, approximately 1 A for a discrete MOSFET or 5-10 A for a MOSFET module with multiple die in parallel, wherein current source is to provide current for multiple such MOSFETs.

Current source circuit 114 may be configured to provide current source 116 to apparatus output or output terminal 108 when voltage input VIN 104 rises above a first threshold and before voltage input VIN 104 rises above a second threshold. The thresholds may be of any suitable value and stored in any suitable manner, such as in memory, fuses, registers, or reference voltage dividers. In FIG. 1, these may be illustrated as first threshold voltage VTH1 110 and second threshold voltage VTH2 112, respectively.

In one example, upon voltage input VIN 104 rising above a second threshold voltage VTH2 112, current source circuit 114 might not provide current source 116 to apparatus output or output terminal 108 again until voltage input VIN 104 has first fallen again below first threshold voltage VTH1 110. Current source circuit 114 may be configured to otherwise provide no current source to apparatus output or output terminal 108.

The phenomena of voltage input VIN 104 rising above first threshold VTH1 110 and before voltage input VIN 104 reaches second threshold VTH2 112 may correspond to a switch-on or turn-on signal to be issued to output MOSFET 102. While the particular voltage thresholds and evaluation described above may be used, any suitable technique for determining a turn-on or switch-on signal on voltage input VIN 104 may be used. In various examples, current source circuit 114 may only be activated to provide current source 116 to apparatus output or output terminal 108 when voltage input VIN 104 is transitioning from below first threshold VTH1 110 to above second threshold VTH2 112, but not when voltage input VIN 104 is transitioning from above second threshold VTH2 112 to below first threshold VTH1 110. Such a transition may instead be representative of a turn-off or switch-off signal of voltage input VIN 104 to be issued to output MOSFET 102.

Voltage clamp circuit 118 may be configured to provide a clamped on-state output voltage to apparatus output or output terminal 108 when voltage input VIN 104 rises above second threshold voltage VTH2 112. The clamped on-state output voltage may be of any suitable value. The clamped on-state output voltage may be, for example, the voltage of a source of a supply such as VDD. Voltage clamp circuit 118 may be configured to provide a clamped off-state output voltage to apparatus output or output terminal 108 when voltage input VIN 104 falls below first threshold voltage VTH1 110. The clamped off-state output voltage may be of any suitable value. The clamped on-state output voltage may be, for example, the voltage of a sink of a supply such as −Vee.

Current sink circuit 120 may include a current sink 122. Current sink 122 may be implemented in any suitable manner, such as by analog circuitry, digital circuitry, application-specific integrated circuit, field programmable gate arrays, programmable logic, instructions for execution by a processor (not shown), or any suitable combination thereof. Current sink 122 may be implemented by, for example, an inductor operating in continuous charge mode. Current sink 122 may be configured to provide a current of any suitable value. The suitable value may be, for example, approximately 1 A for a discrete MOSFET or 5-10 A for a MOSFET module with multiple die in parallel, wherein current source is to provide current for multiple such MOSFETs.

Current sink circuit 120 may be configured to provide current sink 122 to apparatus output or output terminal 108 when voltage input VIN 104 falls below second threshold voltage VTH2 112 and before voltage input VIN 104 falls below threshold voltage VTH1 110.

In one example, current sink circuit 120 might not provide current sink 122 to apparatus output or output terminal 108 until voltage input VIN 104 has first risen above second threshold voltage VTH2 112, and thereafter falls below second threshold voltage VTH2 112. Once threshold voltage VTH2 112 falls below second threshold voltage VTH2 112, current sink circuit 120 might not again provide current sink 122 to apparatus output or output terminal 108 until voltage input VIN 104 has again risen above second threshold voltage VTH2 112.

The phenomena of voltage input VIN 104 falling below second threshold VTH 112 and then below first threshold VTH1 110 may correspond to a switch-off or turn-off signal to be issued to output MOSFET 102. While the particular voltage thresholds and evaluation described above may be used, any suitable technique for determining a turn-off or switch-off signal on voltage input VIN 104 may be used. In various examples, current sink circuit 120 may only be activated to provide current sink 122 to apparatus output or output terminal 108 when voltage input VIN 104 is transitioning from above second VTH 122 to below first threshold VTH1 110, but not when voltage input VIN 104 is transitioning from above first threshold voltage VTH1 110 to above second threshold VTH2 112. Such a transition may instead be representative of a turn-on or switch-on signal of voltage input VIN 104 to be issued to output MOSFET 102.

Apparatus 100 may be configured to drive turn-on and turn-off signals represented by edges in VIN with current sources 116, 112. As per the capacitance equation (current=capacitance*change in voltage/change in time), a current source or sink traverses the turn-on and turn-off events faster, including the Miller plateau. The capacitance between the gate and source of output MOSFET 102, Cgs, may be charged with a constant current of current source 116 and the nonlinear voltage-sourced drive waveforms that often stall at the Miller plateau may be improved. These faster switching times may allow for lower switching losses, improved inverter and system efficiency, and less time spent in the Miller plateau. This may prevent the onset of differential oscillations between instances of output MOSFET 102 as well as reduce the time for the oscillation to build or couple. Application of current sink 122 may improve circuit and system reliability by reducing switching losses, reducing switching times and increasing immunity to C*dv/dt turn-on and turn-off transients caused by fast commutation and Crss coupling into the Cgs of output MOSFET 102 and gate drive circuitry of apparatus 100. The clamped output voltage from voltage clamp circuit 118 may be used to maintain low impedance at the voltages corresponding to the saturated on and off state drives levels. Current sink 122 and current source 116 may be independently implemented, thus allowing separate possible current levels for turn-on and turn-off. Inventors of examples of the present disclosure have discovered that the examples of the present disclosure and use of apparatus 100 may improve switching times by as much as 70%.

However, inventors of examples of the present disclosure have discovered that simply driving the gate of output MOSFET 102 with current source 116 and current sink 120 (and voltage limits within the max Vgs of output MOSFET 102) in practice may tend to negate the advantages discovered. To accomplish fast switching, Cgs of output MOSFET 102 may be driven below the threshold voltage of output MOSFET 102. Whereas a typical MOSFET may have a threshold voltage in the range of 3V, the off-state supply voltage may be in the range of approximately −5V. The Crss of output MOSFET 102 forms a voltage divider with Cgs when output MOSFET 102 commutates, and the faster the commutation, the more charge that is coupled into Cgs and the associated gate drive circuitry. If the gate of output MOSFET 102 were driven solely with a current source, such a current source typically has an output impedance at or near infinity, which is not a suitable clamp.

By driving the Cgs of output MOSFET 102 with current source 116 and current sink 122, operation of output MOSFET 102 traverses the Miller plateau faster. At the onset of the Miller plateau, the channel of output MOSFET 102 is accumulating charge. By the end of the Miller plateau, the channel has accumulated charge and the drain voltage is dropping. When this is traversed beyond in the positive direction, output MOSFET 102 saturated and the channel ultimately resistance drops to Rdson. By using current source 116 to charge the gate capacitance output MOSFET 102, output MOSFET 102 can be switched faster for a given gate current of output MOSFET 102. By using a constant current source such as current source 116, the Miller plateau may be linearized, traverse between off on faster and with less switching energy than other drivers. Apparatus 100 may accomplish both low impedance clamping (via a voltage sourced clamp such as voltage clamp circuit 118 to clamp to the positive or negative power supply voltage of apparatus 100) and faster traverse of the Miller plateau in the off and on direction (through current source circuit 114 and current sink circuit 122).

As discussed above, current source 116 and current sink 122 may be implemented in any suitable manner. Current source 116 and current sink 122 may have sufficient charge such that when they are switched to output MOSFET 102 to charge or discharge Cgs, respective inductors in current source 116 and current since 122 therein may have more than enough stored and current ripple may be minimal. Moreover, current source 116 and current sink 122 may be implemented by a constant current switch mode supply.

Figure 2:
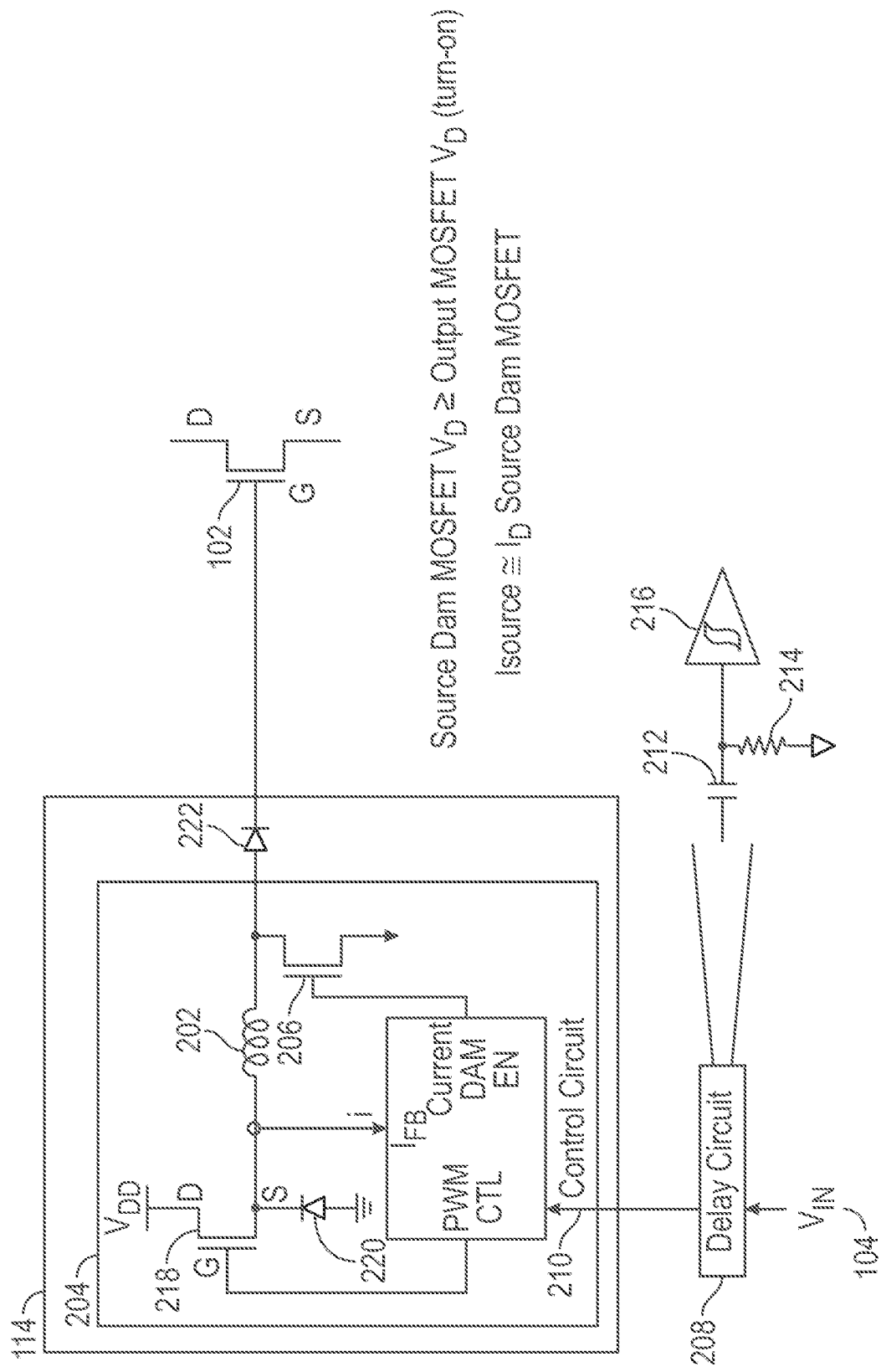
FIG. 2 is a more detailed illustration of an apparatus and, in particular, illustrates an example implementation of a current source circuit.

FIG. 2 is a more detailed illustration of apparatus 100, and in particular, illustrates an example implementation of current source circuit 114.

Current source circuit 114 may receive voltage input VIN 104. In one example, current source circuit 114 may receive voltage input VIN 104 through a delay circuit 208. Delay circuit 208 may be implemented in any suitable manner, such as by analog circuitry, digital circuitry, application-specific integrated circuit, field programmable gate arrays, programmable logic, instructions for execution by a processor (not shown), reference voltage dividers, or any suitable combination thereof.

Delay circuit 208 may be implemented by, for example, a Schmitt trigger buffer 216. An input of Schmitt trigger buffer 216 may be connected to a capacitor 212, the other side of which may be connected to voltage input VIN 104. The input of Schmitt trigger buffer 216 may also be connected to a resistor 214, which may in turn be connected to ground. The values of capacitor 212 and resistor 214 may be selected so as to cause a delay that operates in a short peak mode to capture turn-on and turn-off commands in the form of edges on VIN 104.

Another instance of delay circuit 208 may be used in conjunction with current sink circuit 120. The values of capacitor 212 and resistor 214 may be the same in the two instances of delay circuit 208.

Output of delay circuit 208 may be provided to current source circuit 114. The delay provided by delay circuit 208 upon a changed edge on VIN 104 may inhibit the current dam provided by current source circuit 114 and allow the current to charge Cgs of output MOSFET 102.

After this small delay, a low impedance voltage clamp 118 may be applied to keep the gate circuit impedance at absolute minimum. This allows the driver and driven device maximal immunity to C*dv/dt turn on events.

Current source circuit 114 may include a source current dam circuit 204. Source current dam circuit 204 may include a current source 202. Current source 202 may be implemented in any suitable manner, such as by an inductor connected to a switching power supply, operating from VDD. Current source 202 may implement current source 116. Current source 202 may be driven by a transistor 218. Transistor 218 may be supplied voltage from VDD and operated in a pulsed-width modulation (PWM) manner to selectively apply VDD to current source 202 so as to cause current source 202 to be continuously conducting.

Source current dam circuit 204 may be configured to release the current of current source 202 to output MOSFET 102 upon turn-on event such as a rising edge on VIN 104, traversing VTH1 to VTH2. As VIN 104 passes through VTH2, the current dam may be enabled, steering current source 202 around current source circuit 114. The rising edge may be delayed according to delay circuit 208.

Source current dam circuit 204 may be implemented in any suitable manner, such as by analog circuitry, digital circuitry, application-specific integrated circuit, field programmable gate arrays, programmable logic, instructions for execution by a processor (not shown), or any suitable combination thereof.

Source current dam circuit 204 may include a control circuit 210, implemented in any suitable manner, such as by analog circuitry, digital circuitry, application-specific integrated circuit, field programmable gate arrays, programmable logic, power semiconductors, instructions for execution by a processor (not shown), or any suitable combination thereof.

Source current dam circuit 204 may include any suitable switch, such as a source dam MOSFET 206, configured to release current of current source 202 to the gate of output MOSFET 102. A terminal, such as the drain of source dam MOSFET 206 may be connected to current source 202. Such a terminal may also be connected to the gate of output MOSFET 102. Another terminal, such as the source of source dam MOSFET 206 may be connected to ground. The gate of source dam MOSFET 206 may be controlled by control circuit 210. Control circuit 210 may add any additional conditions needed to activate source dam MOSFET 206 to release current source 202 to the gate of output MOSFET 102. A diode 222 may be placed with its anode connected to a connection point of the first terminal of source dam MOSFET 206 and current source 202, and its cathode connected to the gate terminal of output MOSFET 102.

Control circuit 210 may have a current dam enable output connected to the gate of source dam MOSFET 206 to turn source dam MOSFET on or off according to the input voltage VIN 104 and current feedback collected from current source 202. Control circuit 210 may have a PWM control output connected to the gate of transistor 218. Transistor 218 may in turn may have a diode connected in reverse-bias between the second terminal, such as a source, and ground.

During the turn-on phase of VIN 104, source dam MOSFET 206 may have a drain voltage VD that is greater or equal than the turn-on voltage VG of the gate of output MOSFET 102. The value of current produced by current source 202, given as ILSOURCE, may be approximately equal to the current produced through the drain of source dam MOSFET 206, given as ID.

Although "VDD" and "ground" are used in the present disclosure, any suitable positive and negative power supply voltages may be used.

Figure 3:
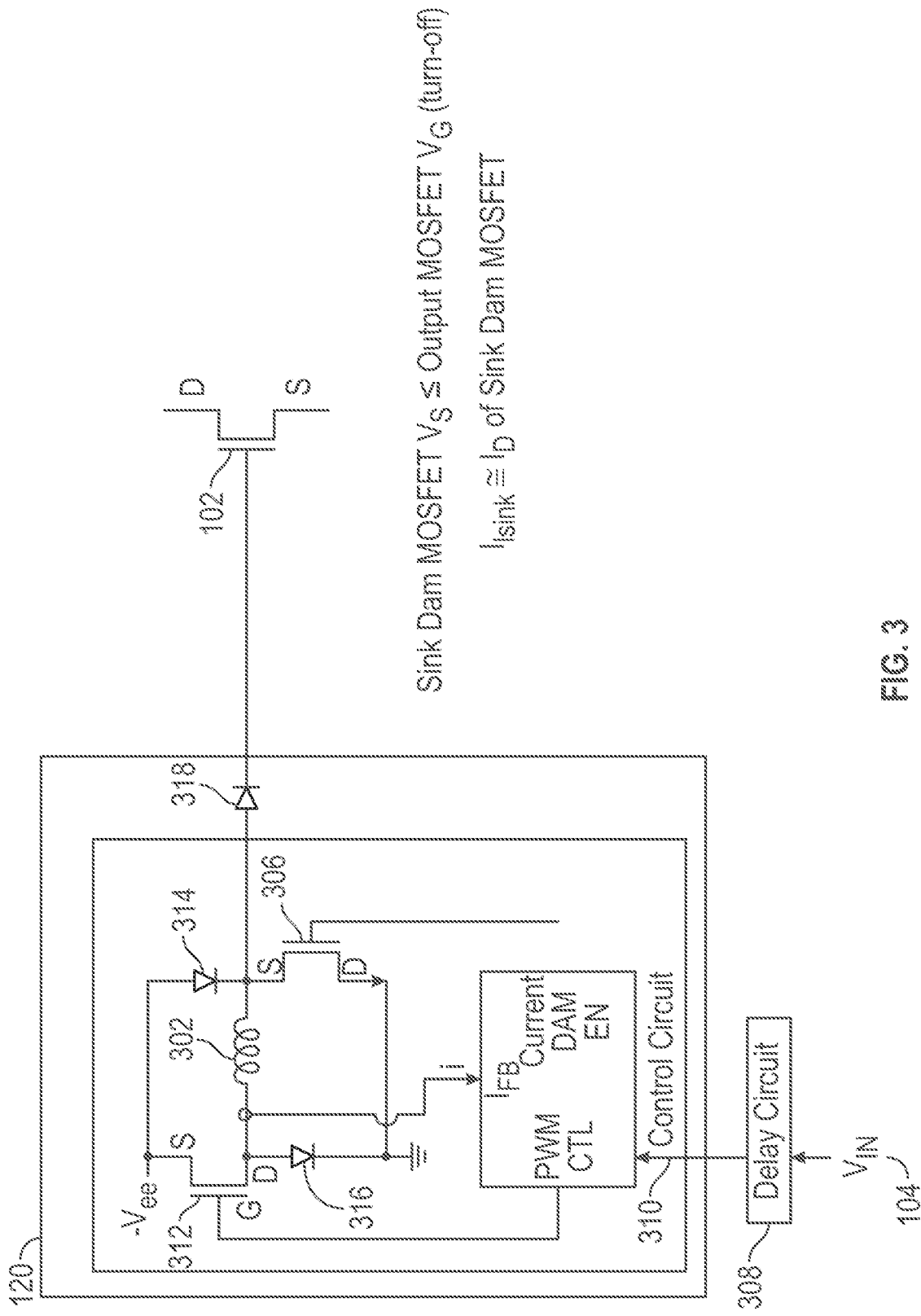
FIG. 3 is a more detailed illustration of an apparatus and, in particular, illustrates an example implementation of a current sink circuit.

FIG. 3 is a more detailed illustration of apparatus 100, and in particular, illustrates an example implementation of current sink circuit 120.

Current sink circuit 120 may receive voltage input VIN 104. In one example, current sink circuit 120 may receive voltage input VIN 104 through a delay circuit 308. Delay circuit 308 may be implemented in any suitable manner, such as by analog circuitry, digital circuitry, application-specific integrated circuit, field programmable gate arrays, programmable logic, instructions for execution by a processor (not shown), reference voltage dividers, or any suitable combination thereof.

Delay circuit 308 may be implemented by a same or different instance of delay circuit 208. The values of capacitor 212 and resistor 214 in the instance of delay circuit 308 may be selected so as to cause a delay that operates in a short peak mode to capture turn-on and turn-off commands in the form of edges on VIN 104.

Output of delay circuit 308 may be provided to current sink circuit 120. The delay provided by delay circuit 208 upon a changed edge on VIN 104 may inhibit the current dam provided by current sink circuit 120 and allow the current sinking of Cgs of output MOSFET 102.

Current sink circuit 120 may include a sink current dam circuit 304. Sink current dam circuit 304 may include a current sink 302. Current sink 302 may be implemented in any suitable manner, such as by an inductor connected to a negative switching sink power supply, operating from, for example, −Vee. Current source 302 may implement current sink 122. Current sink 302 may be driven by a transistor 312. Transistor 312 may be supplied voltage from −Vee and operated in a PWM manner to selectively apply −Vee to current sink 302 so as to cause current sink 302 to be continuously conducting.

Sink current dam circuit 304 may be configured to release the current of current sink 302 to output MOSFET 102 upon turn-off event such as a falling edge on VIN 104. After the falling signal traverse VTH1, voltage clamp circuit 118 may be enabled to clamp Cgs of MOSFET 102 to −Vee. The falling edge may be delayed according to delay circuit 308.

Sink current dam circuit 304 may be implemented in any suitable manner, such as by analog circuitry, digital circuitry, application-specific integrated circuit, field programmable gate arrays, programmable logic, instructions for execution by a processor (not shown), or any suitable combination thereof.

Sink current dam circuit 304 may include a control circuit 310, implemented in any suitable manner, such as by analog circuitry, digital circuitry, application-specific integrated circuit, field programmable gate arrays, programmable logic, instructions for execution by a processor (not shown), or any suitable combination thereof.

Sink current dam circuit 304 may include any suitable switch, such as a sink dam MOSFET 306, configured to release current of current sink 302 to drain the gate of output MOSFET 102. A terminal, such as the source of sink dam MOSFET 306, may be connected to current source 302 and a cathode of a diode 318. The anode of diode 318 may be connected to the gate of output MOSFET 102. Another terminal, such as the drain of sink dam MOSFET 306, may be connected to ground. The gate of sink dam MOSFET 306 may be controlled by control circuit 310. Control circuit 310 may add any additional conditions needed to activate source dam MOSFET 306 to release current source 302 to the gate of output MOSFET 102.

Control circuit 210 may have a current sink enable output connected to the gate of sink dam MOSFET 306 to turn sink dam MOSFET 306 on or off according to the input voltage VIN 104 and current feedback collected from current sink 302. Control circuit 210 may have a PWM control output connected to the gate of transistor 312. Transistor may be connected at a first terminal, such as a source, to a supply such as −Vee, and to ground at a second terminal, such as a drain. Transistor 312 may in turn may have a diode connected in forward-bias between the second terminal, such as a drain, and ground. Moreover, another diode 314 may be connected in forward-bias between −Vee and the source of sink dam MOSFET 306.

During the turn-off phase of VIN 104, sink control MOSFET 309 may have a source voltage VS that is less than or equal than the turn-off voltage VG of the gate of output MOSFET 102. The value of current produced by current sink 302, given as ILSOURCE, may be approximately equal to the current produced through the drain of source dam MOSFET 306, given as ID.

Although "Vee" and "ground" are used in the present disclosure, any suitable positive and negative power supply voltages may be used.

Figure 4:
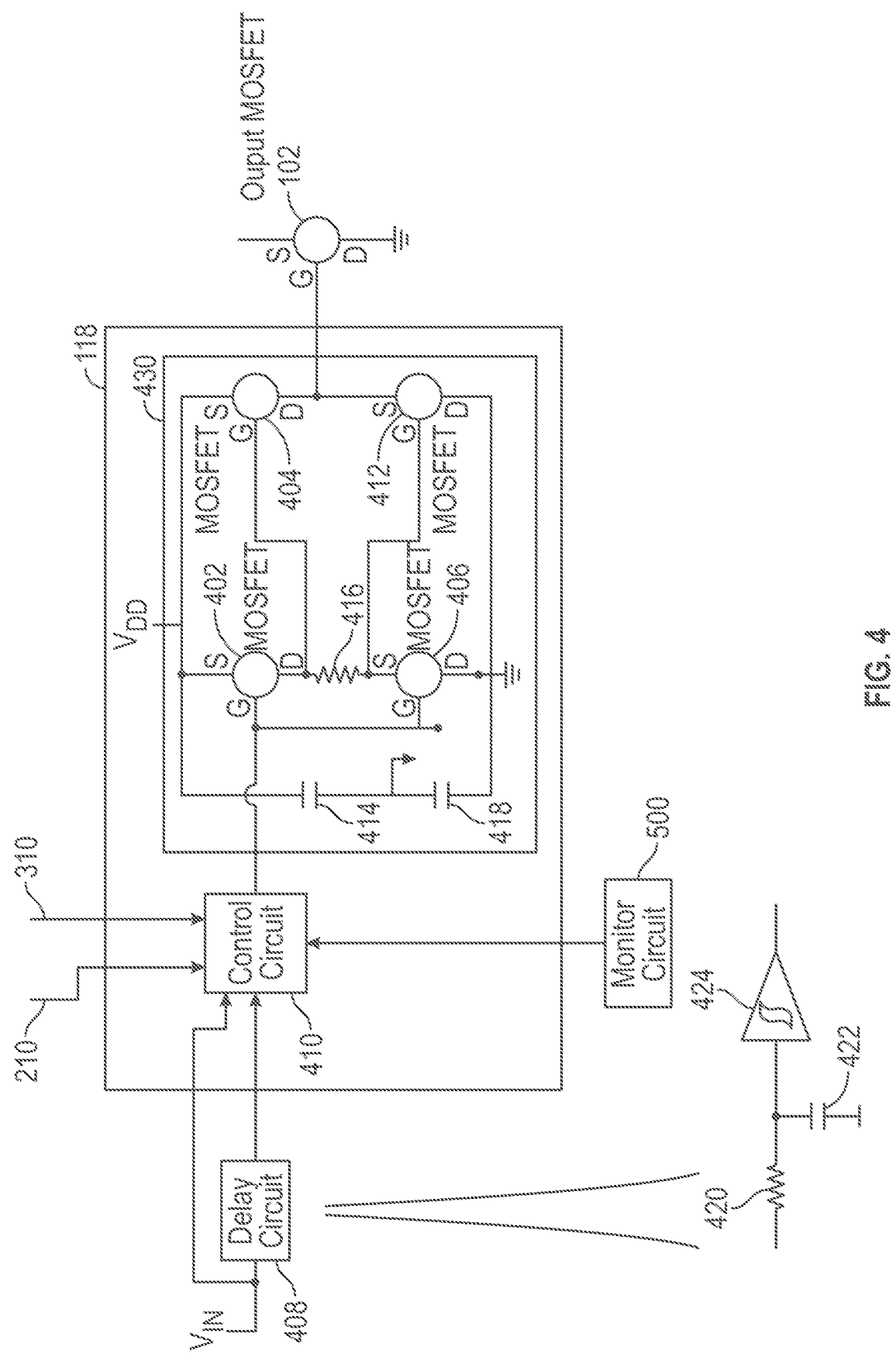
FIG. 4 is a more detailed illustration of an apparatus and, in particular, illustrates an example implementation of a voltage clamp circuit.

FIG. 4 is a more detailed illustration of apparatus 100, and in particular, illustrates an example implementation of voltage clamp circuit 118.

Voltage clamp circuit 118 may receive voltage input VIN 104.

In one example, voltage clamp circuit 118 may receive voltage input VIN 104 through a delay circuit 408. In another example, voltage clamp circuit 118 may receive voltage input VIN 104 without use of delay circuit 407.

Delay circuit 408 may be implemented in any suitable manner, such as by analog circuitry, digital circuitry, application-specific integrated circuit, field programmable gate arrays, programmable logic, reference voltage divider, instructions for execution by a processor (not shown), or any suitable combination thereof. Delay circuit 408 may be implemented in a different manner than delay circuits 208, 308.

Delay circuit 408 may be implemented by, for example, a Schmitt trigger buffer 424. An input of Schmitt trigger buffer 424 may be connected to a capacitor 422, the other side of which may be connected to ground. The input of Schmitt trigger buffer 216 may also be connected to a resistor 420, which may in turn be connected to voltage input VIN 104. The values of capacitor 422 and resistor 420 may be selected so as to cause a delay that operates after VTH2 is traversed in the positive direction for the turn-on clamp and after VTH1 is traversed in the negative direction for the turn-off clamp.

Voltage clamp circuit 118 may include a control circuit 410. Control circuit 410 may be implemented in any suitable manner, such as by analog circuitry, digital circuitry, application-specific integrated circuit, field programmable gate arrays, programmable logic, instructions for execution by a processor (not shown), or any suitable combination thereof.

In one example, control circuit 410 may receive inputs from control circuits 210, 310. Such inputs from control circuits 210, 310 may be used to evaluate the operation of sink and source current circuits 114, 120. The inputs may indicate whether current sink 122 or current source 120 are applied to output MOSFET 102.

In another example, control circuit 410 may receive an input from a monitor circuit 500. Monitor circuit 500 may be implemented in any suitable manner, such as by analog circuitry, digital circuitry, application-specific integrated circuit, field programmable gate arrays, programmable logic, instructions for execution by a processor (not shown), or any suitable combination thereof. Monitor circuit 500 is shown in more detail in FIG. 5, discussed in further detail below.

In one example, control circuit 410 may output a control signal to a clamp subcircuit 430, which in turn may issue a control signal to the gate of output MOSFET 102. In another example, control circuit 410 may output a control signal directly to the gate of output MOSFET 102.

Subcircuit 430 may implement a voltage clamp with a low impedance. The low impedance may be defined by the saturated on-resistance of MOSFET 404 or MOSFET 412. Subcircuit 430 may include input MOSFETs 402, 406 connected in series, wherein the drain of input MOSFET 402 is connected to a first end of resistor 414 and the source of input MOSFET 406 is connected to the second end of resistor 414. Input from control circuit 410 may be connected to the gates of input MOSFETs 402, 406. The source of input MOSFET 402 may be connected to VDD and the drain of input MOSFET 406 may be connected to Vee.

Subcircuit 430 may include output MOSFETs 404, 412 connected in series, wherein the drain of output MOSFET 404 is connected to the source of output MOSFET 412. The source of output MOSFET 404 may be connected to VDD and the drain of output MOSFET 412 may be connected to Vee. A capacitor 414 may be connected between VDD and ground. A capacitor 411 may be connected between Vee and ground. These capacitors may operate in parallel with the remainder of subcircuit 430 and provide bypassing. Typical values of these capacitors may be, for example, in the range of 1-10 microFarads. The drain of input MOSFET 402 may be connected to the gate of output MOSFET 404. The source of input MOSFET 406 may be connected to the gate of output MOSFET 412. The source of output MOSFET 412 and the drain of output MOSFET 404 may be connected to the gate of output MOSFET 102.

Figure 5:
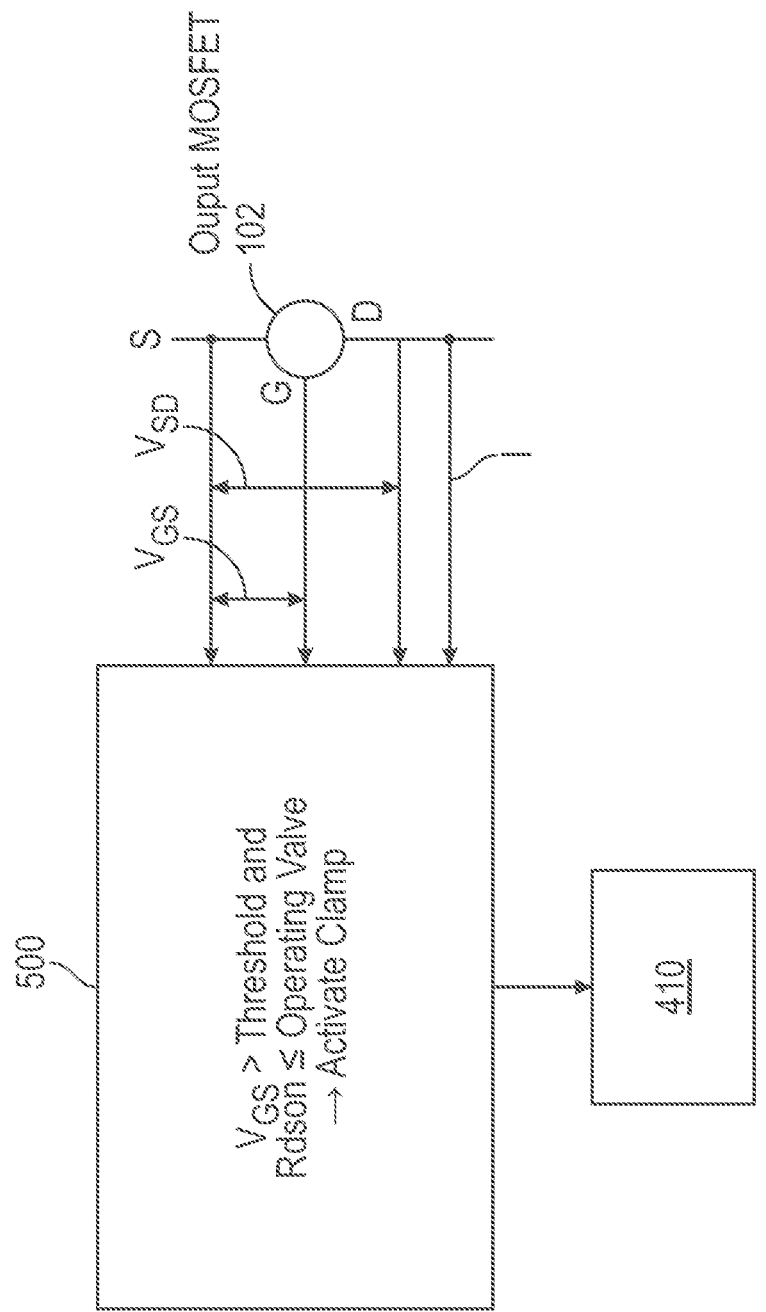
FIG. 5 is a more detailed illustration of an apparatus and, in particular, illustrates an example implementation of a monitor circuit.

FIG. 5 is a more detailed illustration of apparatus 100, and in particular, illustrates an example implementation of monitor circuit 500.

Monitor circuit 500 may include any suitable sensors to determine voltages and currents seen by output MOSFET 102. For example, monitor circuit 500 may be configured to determine VGS, VDS, or the drain current ID of output MOSFET 102. Monitor circuit 500 may determine from these whether VGS is above second threshold voltage 112 and whether the RDSon value (the resistance across output MOSFET 102 when switched on) has reached a specified operating value. The specified operating value may be set according to the characteristics of output MOSFET 102; that is, the RDSon value inherent to output MOSFET 102. When such a condition is reached, a positive clamp value may be applied by clamp circuit 410. The positive clamp value may be released by clamp circuit 410 when VGS is below second threshold 112 and the RDSon value has risen past the specified value. The VGS threshold values may be set according to the characteristics of output MOSFET 102; that is, the VGS values that output MOSET 102 has when turned on or off, or to activate or deactivate output MOSFET 102.

Control circuits 210, 310, 410 may operate at a frequency much faster than the frequency at which output MOSFET 102 may operate. For example, control circuits 210, 310, 410 may operate at a frequency of 300 KHz while output MOSFET 102 may operate at 30 KHz. Control circuits 210, 310 may operate switches or MOSFETs (not shown) between VDD, Vee, and current sources 202, 302 in a PWM manner so as to deliver constant source and sink current, respectively. Control circuit 210 may briefly switch source dam MOSFET 206 on during an initial rising edge of VIN 104. Conversely, control circuit 310 may briefly switch sink dam MOSFET 306 on during a falling edge of VIN 104. Control circuit 410 may hold output MOSFET 404 on for the duration of a logic high value of VIN 104, while holding output MOSFET 412 off. This may clamp source current. Conversely, control circuit 410 may hold output MOSFET 404 off for the duration of a logic low value of VIN 104, while holding output MOSFET 412 on. This may clamp sink current.

Figure 6A:
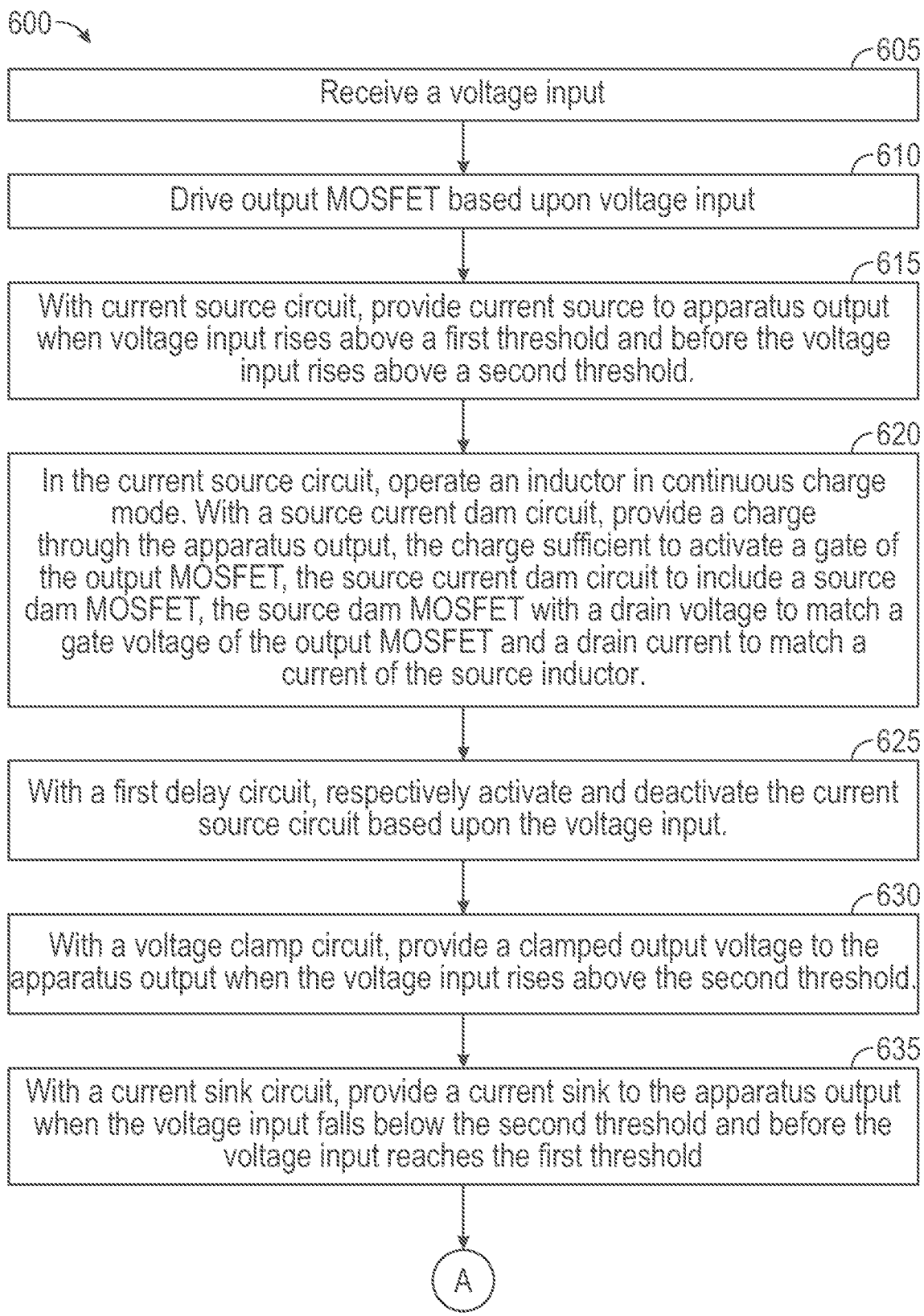
FIGS. 6A and 6B are an illustration of an example method for providing a current sourced, voltage clamped, high speed MOSFET driver.
Figure 6B:

FIGS. 6A-6B are an illustration of an example method 600 for providing a current sourced, voltage clamped, high speed MOSFET driver. Method 600 may be performed by any suitable element, such as by the apparatuses, systems, and components thereof shown and described in FIGS. 1-5. Method 600 may be performed with any suitable number and kind of steps, including those shown in FIGS. 6A-6B. Moreover, method 600 may be performed with more or fewer steps than shown in FIGS. 6A-6B. The steps of FIGS. 6A-6B may be optionally omitted, repeated, performed in parallel with respect to other steps, or performed recursively with respect to other steps.

At 605, a voltage input may be received at an apparatus.

At 610, the apparatus may drive an output MOSFET based upon the voltage input. This may include any suitable number of additional steps.

At 615, with a current source circuit, a current source may be provided to apparatus output when the voltage input rises above a first threshold and before the voltage input rises above a second threshold.

At 620, in the current source circuit, an inductor may be operated in continuous charge mode. With a source current dam circuit, a charge may be provided through the apparatus output, wherein the charge is sufficient to activate a gate of the output MOSFET. The source current dam circuit may include a source dam MOSFET. The source dam MOSFET may include a drain voltage to match a gate voltage of the output MOSFET and a drain current to match a current of the source inductor.

At 625, with a first delay circuit, the current source circuit may be respectively activated and deactivated based upon the voltage input.

At 630, with a voltage clamp circuit, a clamped output voltage may be provided to the apparatus output when the voltage input rises above the second threshold.

At 635, with a current sink circuit, a current sink may be provided to the apparatus output when the voltage input falls below the second threshold and before the voltage input reaches the first threshold.

At 640, with a second delay circuit, the voltage clamp circuit may be respectively activated and deactivated based upon the voltage input.

At 645, in the current sink circuit, a sink inductor may be operated in a continuous charge mode. With a sink current dam circuit, sinking of a charge through the apparatus output may be provided. The charge may be sufficient to deactivate a gate of an output MOSFET connected to the apparatus output. The sink dam circuit may include a sink dam MOSFET. The sink dam MOSFET may include a drain voltage to match a gate voltage of the output MOSFET and a drain current to match a current of the sink inductor.

At 650, with a third delay circuit, the current sink circuit may be respectively activated and deactivated based upon the voltage input. The first and third delay circuits may be a same circuit.

At 655, with the voltage clamp circuit, a low impedance may be applied to a gate and a source of an output MOSFET connected to the apparatus output while the current sink circuit or the voltage source circuit are active.

At 660, with a monitor circuit, VGS may be monitored across a gate terminal and a source terminal of an output MOSFET connected to the apparatus output. It may be determined that VGS is above a threshold value of the output MOSFET and that an Rdson value of the output MOSFET has reached an operating value. Based upon a determination that VGS is above the threshold value of the output MOSFET and that the Rdson value of the output MOSFET has reached the operating value, the voltage clamp circuit may be activated.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

I claim:

1. An apparatus, comprising:
an apparatus input to receive a voltage input;
an apparatus output to drive an output metal oxide semiconductor field effect transistor (MOSFET) at least partially based upon the voltage input;
a current source circuit to provide a current source to the apparatus output when the voltage input rises above a first threshold and before the voltage input rises above a second threshold;
a current sink circuit to provide a current sink to the apparatus output when the voltage input falls below the second threshold and before the voltage input reaches the first threshold; and
a voltage clamp circuit to provide a first clamped output voltage to the apparatus output when the voltage input rises above the second threshold and a second clamped output voltage to the apparatus output when the voltage input falls below the first threshold.

2. The apparatus of claim 1, wherein the current source circuit includes a source inductor in continuous charge mode and a source current dam circuit, the source current dam circuit to include a source dam MOSFET, the source dam MOSFET with a drain voltage and a drain current to match a gate voltage of the output MOSFET and a drain current to match a current of the source inductor, the source current dam circuit to provide a charge through the apparatus output, the charge sufficient to activate a gate of the output MOSFET.

3. The apparatus of claim 1, wherein the current sink circuit includes a sink inductor in a continuous charge mode and a sink current dam circuit, the sink current dam circuit to include a sink dam MOSFET, the sink dam MOSFET with a source voltage to match a current of the inductor and a gate voltage of the output MOSFET and a drain current to match a current of the sink inductor, the sink current dam circuit to provide sink a charge through the apparatus output, the charge sufficient to deactivate a gate of the output MOSFET.

4. The apparatus of claim 1, comprising a first delay circuit to receive the voltage input and respectively activate and deactivate the current source circuit and the current sink circuit.

5. The apparatus of claim 1, comprising a second delay circuit to receive the voltage input and activate and deactivate the voltage clamp circuit.

6. The apparatus of claim 1, wherein the voltage clamp circuit is to apply a low impedance to a gate and a source of the output MOSFET while the current sink circuit or the voltage source circuit are active.

7. The apparatus of claim 1, comprising a monitor circuit to:
monitor voltage (VGS) across a gate terminal and a source terminal of the output MOSFET;
determine that VGS is above a voltage threshold value of the output MOSFET and an Rdson value of the output MOSFET has reached a specified value; and
based upon a determination that VGS is above the voltage threshold value of the output MOSFET and the Rdson value of the output MOSFET has reached the specified value, activate the voltage clamp circuit.

8. A method, comprising:
at an apparatus input, receiving a voltage input;
at an apparatus output, driving an output metal oxide semiconductor field effect transistor (MOSFET) at least partially based upon the voltage input;
with a current source circuit, providing a current source to the apparatus output when the voltage input rises above a first threshold and before the voltage input rises above a second threshold;
with a current sink circuit, providing a current sink to the apparatus output when the voltage input falls below the second threshold and before the voltage input reaches the first threshold; and
with a voltage clamp circuit, providing a first clamped output voltage to the apparatus output when the voltage input rises above the second threshold and providing a second clamped output voltage to the apparatus output when the voltage input rises above the second threshold.

9. The method of claim 8, comprising:
in the current source circuit, operating a source an inductor in continuous charge mode; and
with a source current dam circuit, providing a charge through the apparatus output, the charge sufficient to activate a gate of an output MOSFET connected to the apparatus output, the source current dam circuit to include a source dam MOSFET, the source dam MOSFET with a drain voltage to match a gate voltage of the output MOSFET and a drain current to match a current of the source inductor.

10. The method of claim 8, comprising:
in the current sink circuit, operating a sink inductor in a continuous charge mode; and
with a sink current dam circuit, providing sinking a charge through the apparatus output, the charge sufficient to deactivate a gate of an output MOSFET connected to the apparatus output, the sink current dam circuit to include a sink dam MOSFET, the sink dam MOSFET with a drain voltage to match a gate voltage of the output MOSFET and a drain current to match a current of the sink inductor.

11. The method of claim 8, comprising, with a first delay circuit, respectively activating and deactivating the current source circuit and the current sink circuit based upon the voltage input.

12. The method of claim 8, comprising, with a second delay circuit, activating and deactivating the voltage clamp circuit based upon the voltage input.

13. The method of claim 8, comprising, with the voltage clamp circuit, applying a low impedance to a gate and a source of an output MOSFET connected to the apparatus output while the current sink circuit or the voltage source circuit are active.

14. The method of claim 8, comprising, with a monitor circuit:
monitoring voltage (VGS) across a gate terminal and a source terminal of an output MOSFET connected to the apparatus output;

determining that VGS is above a threshold value of the output MOSFET and an Rdson value of the output MOSFET has reached a specified value; and based upon a determination that VGS is above the threshold value of the output MOSFET and the Rdson value of the output MOSFET has reached the specified value, activating the voltage clamp circuit.

15. A gate driver integrated circuit, comprising:

an input terminal to receive a voltage input;

an output terminal to drive an output metal oxide semiconductor field effect transistor (MOSFET) at least partially based upon the voltage input;

a current source circuit to provide a current source to the output MOSFET when the voltage input rises above a first threshold and before the voltage input rises above a second threshold;

a current sink circuit to provide a sink current sink to the output MOSFET when the voltage input falls below the second threshold and before the voltage input reaches the first threshold; and a voltage clamp circuit to provide a first output voltage to the output MOSFET when the voltage input rises above the second threshold and a second output voltage to the output MOSFET when the voltage input rises above the second threshold.

16. The gate driver integrated circuit of claim 15, wherein the current source circuit includes a source an inductor in continuous charge mode and a source current dam circuit, the source current dam circuit to include a source dam MOSFET, the source dam MOSFET with a drain voltage and a drain current to match a gate voltage of the output MOSFET and a drain current to match a current of the source inductor, the source current dam circuit to provide a charge to the output MOSFET, the charge sufficient to activate a gate of the output MOSFET.

17. The gate driver integrated circuit of claim 15, wherein the current sink circuit includes a sink an inductor in a continuous charge mode and a sink current dam circuit, the sink current dam circuit to include a dam MOSFET, the dam MOSFET with a source voltage and a drain current to match a gate voltage of the output MOSFET and a drain current to match a current of the sink inductor, the sink current dam circuit to provide sink a charge to the output MOSFET, the charge sufficient to deactivate a gate of the output MOSFET.

18. The gate driver integrated circuit of claim 15, comprising a first delay circuit to receive the voltage input and respectively activate and deactivate the current source circuit and the current sink circuit at least partially responsive to the received voltage input.

19. The gate driver integrated circuit of claim 15, comprising a second delay circuit to receive the voltage input and activate and deactivate the voltage clamp circuit at least partially responsive to the received voltage input.

20. The gate driver integrated circuit of claim 15, wherein the voltage clamp circuit is to apply a low impedance to a gate and a source of the output MOSFET while the current sink circuit or the voltage source circuit are active.

21. The gate driver integrated circuit of claim 15, comprising a monitor circuit to:

monitor voltage (VGS) across a gate terminal and a source terminal of the output MOSFET;

determine that VGS is above a threshold value of the output MOSFET and an Rdson value of the output MOSFET has reached a specified value; and based upon a determination that VGS is above the threshold value of the output MOSFET and the Rdson value of the output MOSFET has reached the specified value, activate the voltage clamp circuit.

* * * * *